United States Patent [19]
Yamazaki et al.

[11] Patent Number: 5,559,355
[45] Date of Patent: Sep. 24, 1996

[54] VERTICAL MOS SEMICONDUCTOR DEVICE

[75] Inventors: Tomoyuki Yamazaki; Shigeyuki Obinata; Masahito Otsuki; Seiji Momota; Tatsuhiko Fujihira, all of Kawasaki, Japan

[73] Assignee: Fuji Electric Co., Ltd., Tokyo, Japan

[21] Appl. No.: 492,854

[22] Filed: Jun. 20, 1995

Related U.S. Application Data

[63] Continuation-in-part of Ser. No. 397,417, Mar. 1, 1995.

[30] Foreign Application Priority Data

Mar. 4, 1994 [JP] Japan .................................. 6-033985
Jun. 22, 1994 [JP] Japan .................................. 6-139748

[51] Int. Cl.[6] .................................................. H01L 29/76
[52] U.S. Cl. ........................ 257/341; 257/135; 257/337; 257/378
[58] Field of Search ................................. 257/341, 337, 257/378, 135

[56] References Cited

U.S. PATENT DOCUMENTS 5,341,003  8/1994  Obinata ................................. 257/341

*Primary Examiner*—Mark V. Prenty
*Attorney, Agent, or Firm*—Brumbaugh, Graves, Donohue & Raymond

[57] ABSTRACT

Mutual interference is reduced between a main cell portion and a sensing cell portion for detecting the current flowing through the main cell portion of a vertical MOS semiconductor device, and accuracy and reliability of overcurrent detection are improved. In the device, well regions of (p) type are formed between the main and sensing cell portions for capturing the minority carriers. Breakdown of the gate oxide film caused by an open emitter electrode of the sensing cell portion is prevented by forming the (p) type well regions with ring shapes, by spacing the (p) type well regions by 5 to 20 μm, and by adjusting the isolation withstand voltage between the main and sensing cell portions below the withstand voltage of the gate oxide film. A voltage spike is minimized by narrowing the overlap of the detecting and gate electrodes for reduced capacitance between these electrodes.

8 Claims, 6 Drawing Sheets

VERTICAL MOS SEMICONDUCTOR DEVICE

This is a continuation-in-part application of U.S. patent application Ser. No. 08/397,417, filed on Mar. 1, 1995.

BACKGROUND OF THE INVENTION

The present invention relates to power semiconductor devices having a MOS gate, as used in inverters and the like.

Insulated gate bipolar transistors (hereinafter referred to as "IGBT") and power MOS field effect transistors (hereinafter referred to as "MOSFET") are voltage driven type semiconductor switching devices used widely in power electronics because of their low on-voltage and high switching speed.

An IGBT-output type inverter device may have an overcurrent flow into the IGBT if there is an inrush current when a motor is activated, and failures such as a load short circuit and arm short circuit occur. Hence, superior electric characteristics are required for protecting the IGBT against the high voltage and current, including a breakdown withstand capability known as a "short-circuit withstand capability."

Inverter devices usually include a protection circuit to detect the occurrence of short-circuit failures, and to turn the power supply off. Such a protection circuit requires 10 to 20 μsec to detect the overcurrent and to effect its protective function. The IGBT must be protected against breakdown during this time.

Many recent high-performance IGBT modules adopt an overcurrent-protection system which is disposed independently of the protection circuit in the inverter device. Such an overcurrent-protection system can quickly detect an overcurrent flowing into the IGBT when a short-circuit failure occurs, can limit the current in the IGBT, and can suppress it to within the short-circuit withstand capacity of the elements by means of a gate control based on this overcurrent detection signal before the power supply is turned off by the protection circuit.

FIG. 6 shows an IGBT overcurrent-protection circuit according to this protection system. Connected in parallel with main element 1 (IGBT) is a current-detection sub-element 2 (IGBT further to the main element 1). The sub-element 2 is also connected in series to a current-detection resistance 3. A switching element 4 (MOSFET) is connected to the gate-driving circuits for the main element 1 and the sub-element 2 to perform on-off operation according to the voltage generated between the two ends of the current-detection resistance 3.

When an overcurrent due to load short-circuit failure or the like flows into the main element 1 and the sub-element 2 and causes the voltage between the ends of the current-detection resistance 3 to exceed the threshold voltage of the switching element 4, the switching element 4 turns on to reduce the gate voltage of both the main element 1 and the current-detection sub-element 2, thus limiting the main current flowing in the main element 1. Thus, the main current can be lowered to within the short-circuit withstand capability of the element 1 by means of adequately setting the resistance of the current-detection resistance 3 and the threshold voltage of the switching element 4.

FIG. 7 is a wave chart showing a main current $I_D$ and a voltage $V_D$ across the main element 1 at the power supply voltage of 400 V while the protective circuit of FIG. 6 limits an overcurrent caused by load short-circuit fault. In FIG. 7, the main element 1 is an IGBT rated at 600 V and 100 A, externally connected to the above-described protective circuit. As shown in FIG. 7, the main current $I_D$ of the IGBT is limited within a few microseconds to about 250 A corresponding to the short-circuit withstand capability set with respect to the rated current of 100 A. It is difficult to maintain the ratio between the operations of the elements 1 and 2 because of the temperature difference between the chips on which the elements 1 and 2 are individually mounted. To solve this problem, a configuration has been proposed wherein the elements 1 and 2 are formed on a common chip.

For example, U.S. Pat. No. 4,783,690 addresses the problem of the temperature difference between the elements 1 and 2 by assigning some of the cells constituting a main MOSFET a role as sensing cells for overcurrent detection, and by leading out from the sensing cells an electrode for overcurrent detection. The following problems remain in this structure: First, the actual ratio between the main current and the current for overcurrent detection deviates from the desired value since a current leaks through a parasitic lateral MOSFET caused between the main and the sensing cell portions. And, since the main cells and the sensing cell portions are adjoining, a leakage current is caused by minority carriers between the main and sensing cell portions. This leakage current further causes deviation of the actual ratio between the main current and the current for overcurrent detection from the desired value.

To solve these problems, the present applicant has disclosed in the above-identified U.S. patent application Ser. No. 08/397,417 a method for reducing the leakage current by expanding the spacing between the main and the sensing cell portions.

FIG. 8 is a sectional view showing an exemplary IGBT device according to the above-identified U.S. Patent Application. A p-type base region 9 is formed selectively at the surface of an n-type base layer 8. An n-type emitter region 10 is formed at the surface of the p-type base region 9. A gate electrode 12 connected to a terminal G is fixed via a gate oxide film 11 to the surface of the portion of the p-type base region 9 extending between the n-type base layer 8 and the n-type emitter region 10. An emitter electrode is fixed via an insulating film 20 to the surface of the device. The emitter electrode is divided into an emitter electrode 14 for a main cell portion 6 and an emitter electrode 15 for a sensing cell portion 7. The emitter electrode 14 is connected to a terminal E and the emitter electrode 15 is connected to a terminal M. A collector electrode 16 connected to a terminal C is fixed to the back surface of a semiconductor substrate 5. The main cell portion 6 and the sensing cell portion 7, delimited by channel regions 13 of the main and sensing cell portions 6 and 7, are spaced by a spacing L of 100 μm or more, long enough to prevent mutual interference between the main and sensing cell portions 6 and 7. A p-type well 17, to which is fixed the emitter electrode 14 of the main cell portion 6, is formed between the main and sensing cell portions 6 and 7 to capture the minority carriers (holes).

The device of FIG. 8 does not fully solve the problems with the device of U.S. Pat. No. 4,783,690. Also, the following problems remain to be addressed: First, if large spaces are placed between the main and sensing cell portions to prevent the leakage current, chip area and cost are increased. Further, the sensing cell portion of a MOS semiconductor devices having a main cell portion and a sensing cell portion may break down upon disconnection of the current detecting resistor when a high voltage is applied between the source and drain or between the collector and emitter in the off-state of the device.

This breakdown is illustrated in FIGS. 9(a) and 9(b). FIG. 9(a) is a circuit diagram showing an equivalent circuit of the IGBT having the main cell portion 6 and the sensing cell portion 7. In FIG. 9(*a*), a high voltage is applied between the collector and emitter of the IGBT, while the emitter terminal M is in the open state. FIG. 9(*b*) is a sectional view of the IGBT in which the main cell portion 6 and the sensing cell portion 7 adjoin one another. In FIGS. 9(*a*) and 9(*b*), the voltage between the collector and the emitter (between the terminals C and E, and between the terminals C and M) of the main cell portion 6 and the sensing cell portion 7 is determined by the collector potential when the junction leakage currents $I_{RE}$ and $I_{RM}$ flow. Since the emitter electrode 14 of the main cell portion is grounded while the emitter electrode 15 of the sensing cell portion is open, the potential of the emitter electrode 15 rises gradually. In response to this potential rise, the voltage between the emitter terminal M and the gate terminal G of the sensing cell portion rises. When the voltage between the terminals M and G greatly exceeds the withstand voltage of the gate oxide film 11, the gate oxide film 11 finally breaks down at "x" in FIG. 9(*b*).

Another problem lies in that a spike noise voltage may occur across the current detecting resistor at the instance when the MOS semiconductor device is turned on.

This spike noise voltage is illustrated in FIGS. 10(*a*) and 10(*b*). FIG. 10(*b*) is a circuit diagram showing an equivalent circuit of the IGBT which is connected to a load and turned on and off. In FIG. 10(*b*), a resistor $R_S$ for detecting a current $I_C$ is connected between the emitter terminals M and E of the sensing and main cell portions 7 and 6. The current $I_C$ is measured by detecting a voltage $V_S$ across the resistor $R_S$. FIG. 10(*a*) is a graph showing gate voltage $V_G$, the current $I_C$, and the detecting voltage $V_S$ during the operation of the circuit of FIG. 10(*b*). Though the voltage $V_S$ should be proportional to the current $I_C$, a spike noise is caused on the voltage $V_S$ at the turn-on of the IGBT. The spike noise is caused by the capacitance between the gate electrode 12 and the emitter terminal 15 of the sensing cell portion 7. In response to the rapid rise of the gate voltage $V_G$ at the turn-on of the IGBT, a displacement current $I_{GM}$ flows through the capacitor $C_{GM}$:

$$I_{GM}=C_{GM} \cdot dV_G/dt$$

The current $I_{GM}$ gives rise to a voltage $V_S$ across the resistor $R_S$:

$$V_S=I_{GM} \cdot R_S=C_{GM} \cdot R_S \, dV_G/dt$$

Accordingly, the voltage is proportional to the capacitance $C_{GM}$ between the gate electrode 12 and the emitter electrode 15 of the sensing cell portion 7, and the rising rate of the gate voltage $V_G$.

SUMMARY OF THE INVENTION

It is an object of the present invention to provide a MOS semiconductor device having a current detecting function which facilitates maintaining the main and detecting currents ratio at a constant value, for preventing the breakdown at the open terminal or at the turn-on of the device, and for protecting the device stably in combination with an overcurrent protective circuit from the overcurrent.

A preferred vertical MOS semiconductor device comprises (a) a semiconductor layer of a first conductivity type, (b) a main cell portion comprising a first base region of a second conductivity type formed selectively at a first surface of the semiconductor layer, with a first emitter region of the first conductivity type formed selectively in the surface of the first base region, a gate electrode fixed via a gate oxide film to a portion of the first base region extending between the semiconductor layer and the first emitter region, and an emitter electrode connected to the surfaces of the first base region and the first emitter region, (c) a sensing cell portion for detecting a current of the main cell portion comprising a second base region of a second conductivity type formed selectively at a second surface of the semiconductor layer, a second emitter region of the first conductivity type formed selectively at the surface of the second base region, with a gate electrode fixed via a gate oxide film to a portion of the second base region extending between the semiconductor layer and the second emitter region, and an emitter electrode connected to the second base region and the second emitter region, and (d) a first well region of the second conductivity type formed between the main and sensing cell portions, the first well region being connected to the emitter electrode of the sensing cell portion.

It is preferable to shape the first well region in annular, or ring, shape. An annular second well region of the second conductivity type is also disposed between the main and sensing cell portions, the second well region being connected with the emitter electrode of the main cell portion. The space between the first and second wells should be between 5 and 20 μm.

The insulation withstand voltage between the emitter electrodes of the main and sensing cell portions is preferably lower than the withstand voltage of the gate

BRIEF DESCRIPTION OF THE DRAWINGS

FIG. 5(*b*) is sectional view taken along the line A—A' of FIG. 5(*a*), showing an upper part of the third embodiment;

FIG. 5(*c*) is sectional view taken along the line B—B' of FIG. 5(*a*), showing an upper part of the third embodiment;

FIG. 9(*b*) is a sectional view of a part of the IGBT of FIG. 9(*a*) at breakdown;

FIG. 10(*b*) is a circuit diagram showing an equivalent circuit of the IGBT.

DETAILED DESCRIPTION

Figure 1:
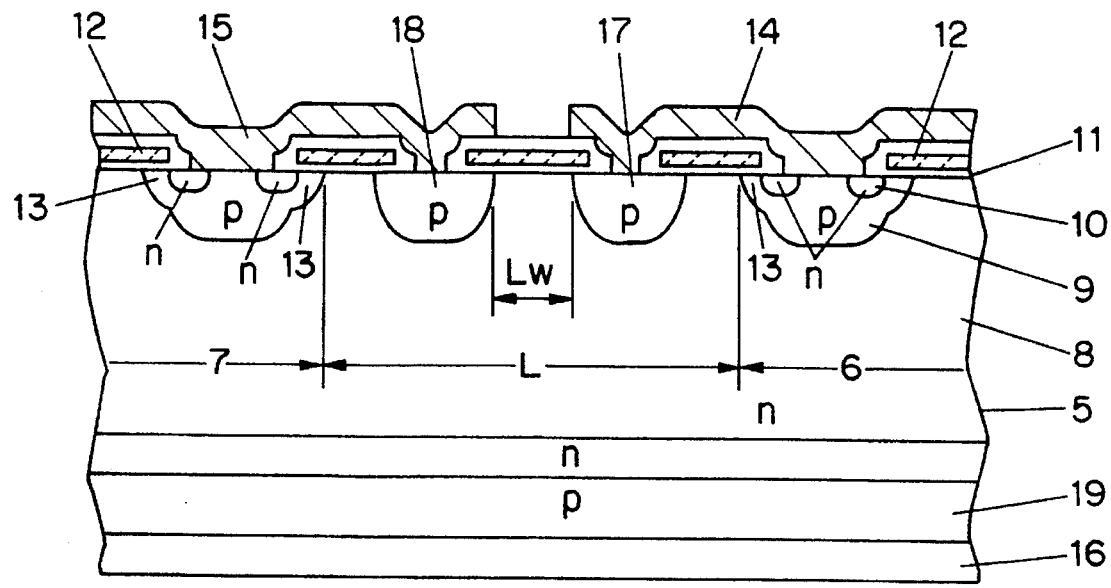
FIG. 1 is a sectional view showing a first embodiment of an IGBT according to the present invention.

In FIG. 1, the main cell portion 6 and the sensing cell portion 7 are divided by a boundary region having a width L. Several cells are integrated in parallel connection with each other on a semiconductor substrate 5. The main cell portion 6 is illustrated on the right hand side of the figure, and the sensing cell portion 7 on the left hand side.

In FIG. 1, a p-type base region 9 is formed selectively in the surface of an n-type base layer 8. An n-type emitter region 10 is formed in the surface of the p-type base region 9. A gate electrode 12 is fixed via a gate oxide film 11 to the surface of a channel region 13 formed in the surface layer in the portion of the p-type base region 9 extending between the n-type base layer 8 and the n-type emitter region 10.

An emitter electrode commonly contacts the surfaces of the n-type emitter region 10 and the p-type base region 9 and is fixed to the surface of the device. The emitter electrode comprises an emitter electrode 14 for a main cell portion 6 and an emitter electrode 15 for a sensing cell portion 7. A collector electrode 16 is fixed to the back surface of a semiconductor substrate 5.

The main cell portion 6 and the sensing cell portion 7 are spaced by a spacing L of 100 μm or more for preventing mutual interference between the main and sensing cell portions 6 and 7, considering the diffusion length of the electrons supplied from the MOSFET and the minority carriers injected from a p-type collector layer 19 to the n-type base layer 8.

A p-type well 17 connected to the emitter electrode 14 of the main cell portion and a p-type well 18 connected to the emitter electrode 15 of the sensing cell portion are formed between the main and sensing cell portions 6 and 7 for capturing the minority carriers. The wells 17 and 18 are spaced by the spacing $L_W$ of 20 μm or less. The spacing $L_W$ is determined by examining the width of the depletion layer under an applied voltage. For example, when the specific resistance of the n-type base layer 8 is 50Ω·cm, the width of the depletion layer expanding under the applied voltage of 20 V is 20 μm. Thus, if the spacing $L_W$ is set at 20 μm or less, the junction leakage current $I_{RM}$ of the sensing cell portion flows to the main cell side at the applied voltage of more than 20 V. Thus, the potential of the emitter electrode 15 is not boosted any more, and the gate oxide film 11 is prevented from breakdown. However, if the spacing $L_W$ is too narrow, the separation effect between the main and sensing cell portions 6 and 7 is insufficient. Thus, 5 to 20 μm is appropriate for the spacing $L_W$.

Figure 2:
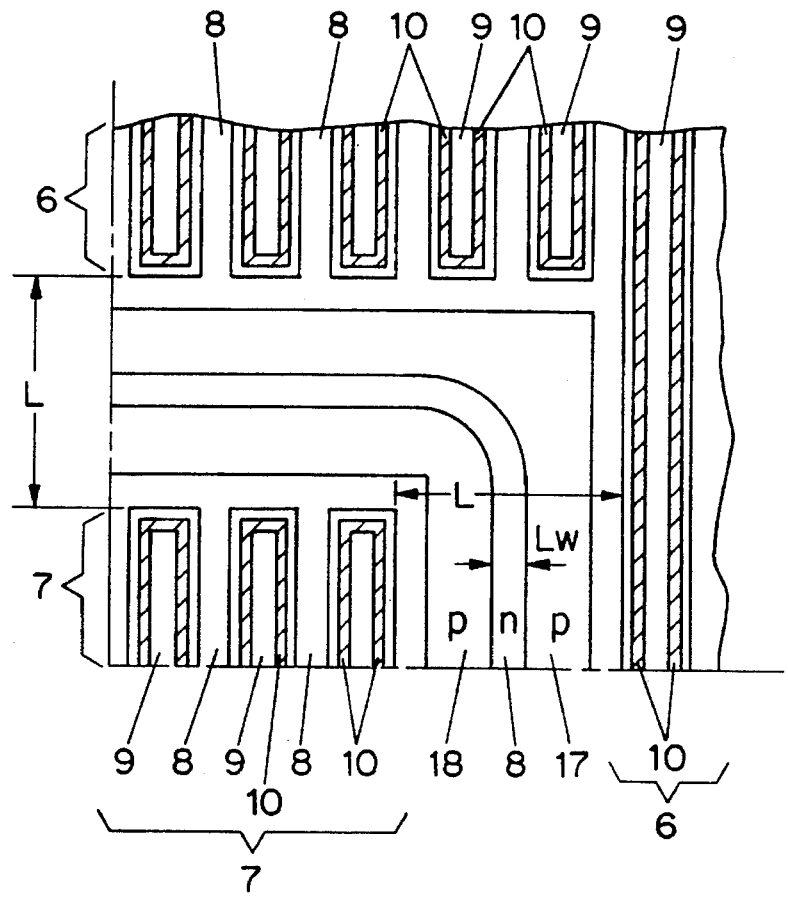
FIG. 2 is a top plan view of the first embodiment.

In FIG. 2, the gate oxide film 11, the emitter electrodes 14 and 15 and their upper structure of FIG. 1 are omitted for clarity. The sensing cell portion 7 occupies the lower left part of the figure. The p-type well 18 for capturing the minority carriers is formed in an annular, or ring, shape surrounding the sensing cell portion 7. The main cell portion 6 is located on the upper right hand side of the figure.

The p-type well 18, electrically connected to the emitter electrode 15 of the sensing cell portion, captures the minority carriers diffusing from the sensing cell portion 7 to the main cell portion 6. The p-type well 17, electrically connected to the emitter electrode 14 of the main cell portion, captures the minority carriers diffusing from the main cell portion 6 to the sensing cell portion 7.

Thus, the leakage current caused by the minority carriers between the main and sensing cell portions 6 and 7 is greatly reduced. The minority carrier capturing efficiency may be improved further by surrounding the sensing cell portion 7 with the annular shaped p-type wells 17 and 18.

It may be also convenient to shorten the spacing between the main and sensing cell portions 6 and 7 in order to decrease the chip area.

Figure 3:
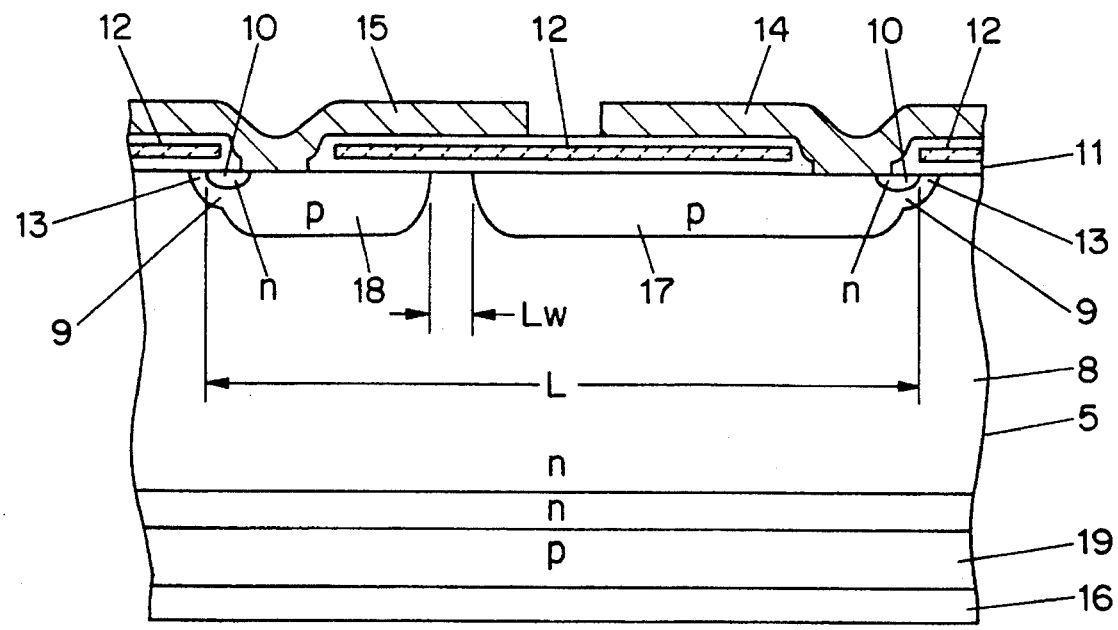
FIG. 3 is a sectional view showing a second embodiment of an IGBT according to the present invention.

In FIG. 3, the boundary region between the main cell portion 6 and the sensing cell portion 7 for current detection is shown. The main cell portion 6 is shown on the right hand side of the figure and the sensing cell portion 7 on the left hand side. A p-type base region 9 is formed selectively on the surface of an n-type base layer 8. An n-type emitter region 10 is formed on the surface of the p-type base region 9. A gate electrode 12, an emitter electrode 14 of the main cell portion 6, an emitter electrode 15 of the sensing cell portion 7, and a collector electrode 16 are disposed in the same manner as in the first embodiment (FIG. 1). However, a p-type well 17 for capturing the minority carriers is connected to the p-type base region 9 of the main cell portion 6. The p-type well 18 is also connected to the p-type base region 9 of the sensing cell portion 7. The spacing region between the main and sensing cell portions 6 and 7 is located between the nearest two neighboring channel regions 13. The main and sensing cell portions 6 and 7 are spaced by the spacing region by the length L of 100 μm or more for preventing the mutual interference of the main and sensing cell portions 6 and 7. This length is determined in consideration of the diffusion length of the electrons supplied from the MOSFET and the minority carriers injected from the p-type collector layer 19 to the base layer 8. Between the main and sensing cell portions, the spacing $L_W$ between the p-type well 17 and the p-type well 18 is set at 20 μm or less.

Figure 4:
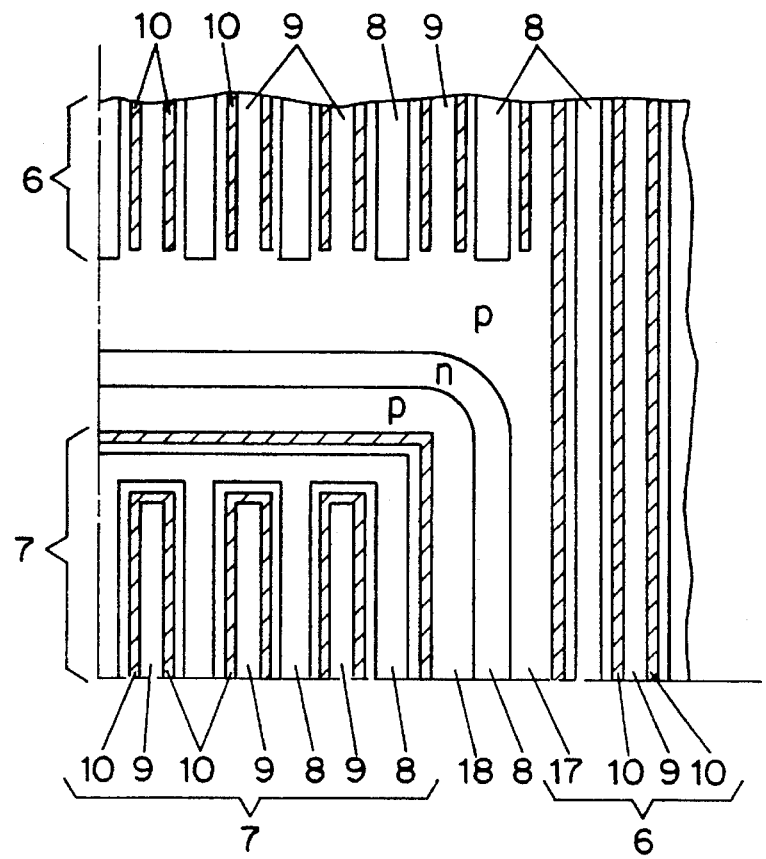
FIG. 4 is a top plan view of the second embodiment.

In FIG. 4, the gate oxide film 11, the emitter electrodes 14, 15 and their upper structure of FIG. 3 are omitted for clarity. The sensing cell portion 7 occupies the lower left part of the figure, and the main cell portion 6 the other part.

In the structure of FIGS. 3 and 4, the p-type well 18 captures the minority carriers diffusing from the sensing cell portion 7 to the main cell portion 6. The p-type well 17 captures the minority carriers diffusing from the main cell portion 6 to the sensing cell portion 7.

Thus, the leakage current caused by the minority carriers between the main and sensing cell portions 6 and 7 is greatly reduced. The minority carrier capturing efficiency may be improved further by surrounding the sensing cell portion 7 with the annular shaped p-type wells 17 and 18.

It may be also convenient to shorten the spacing between the main and sensing cell portions 6 and 7 in order to decrease the chip area.

In the embodiments of FIGS. 1 and of 3, the spacing between the p-type well 17 and the p-type well 18 is short enough for the depletion layer to spread from the sensing cell portion 7 to the main cell portion 6 to avoid breakdown of the gate insulating film 10 even when a voltage is applied to the collector electrode 16 under the open state of the emitter electrode 15 of the sensing cell portion.

Figure 5A:
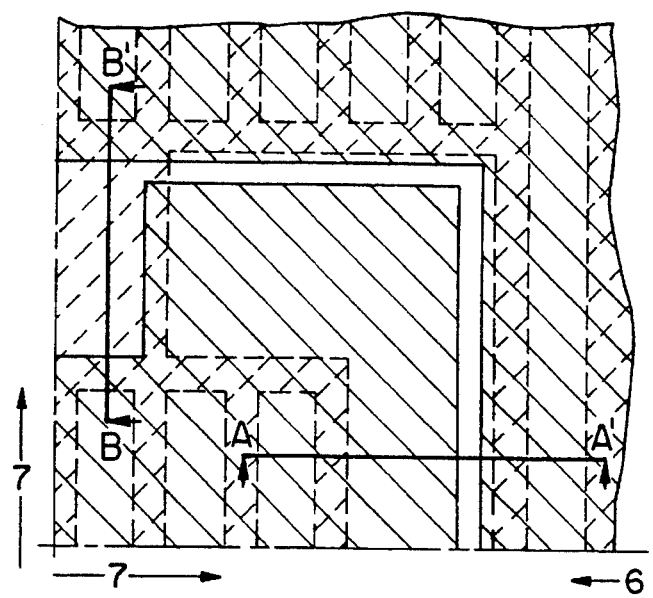
FIG. 5(*a*) is a top plan view of a part of a third embodiment of an IGBT according to present invention.

In FIG. 5(a), the sensing cell portion 7 occupies the lower left part of the figure. The main cell portion 6 is located on the upper right hand side of the figure. The gate electrode 12 is shown by broken-line hatching. The emitter electrode 15 of the sensing cell portion is shown by the narrowly spaced solid-line hatching. The emitter electrode 14 of the main cell portion is shown by the widely spaced solid-line hatching.

Figure 5B:
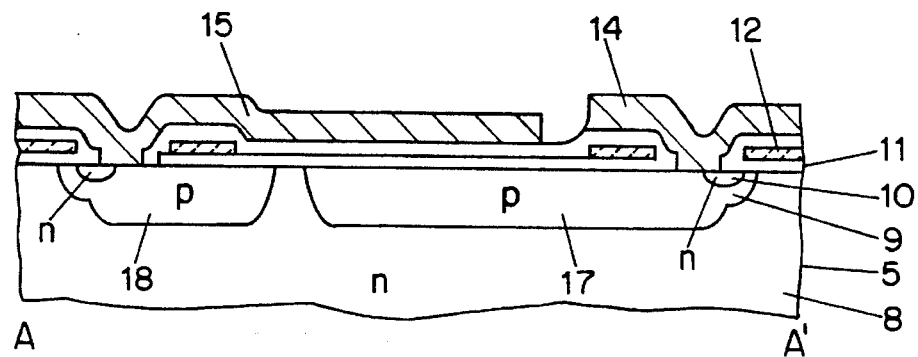
Figure 5C:
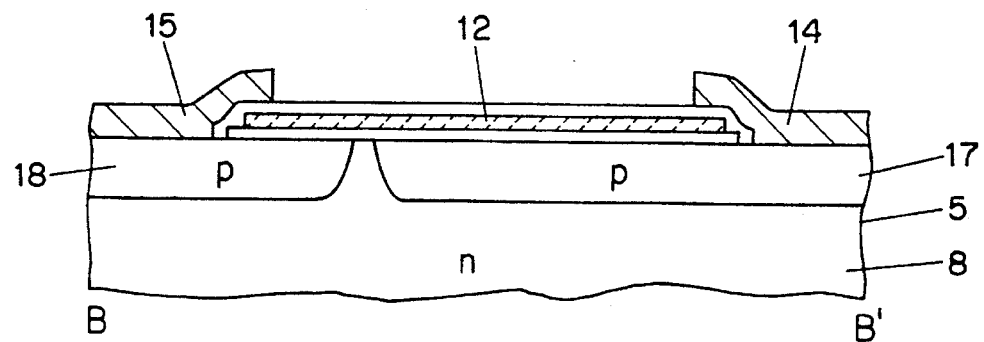
Figure 6:
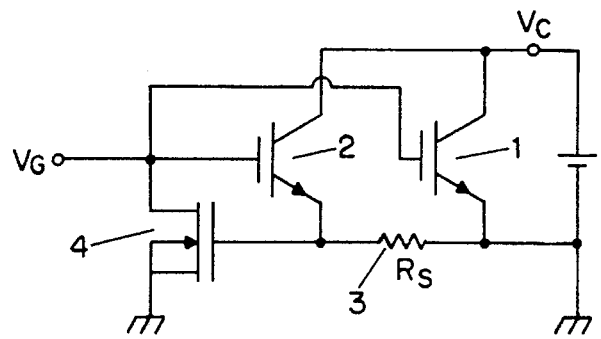
FIG. 6 is a circuit diagram showing an exemplary overcurrent protective circuit for the IGBTs.
Figure 7:
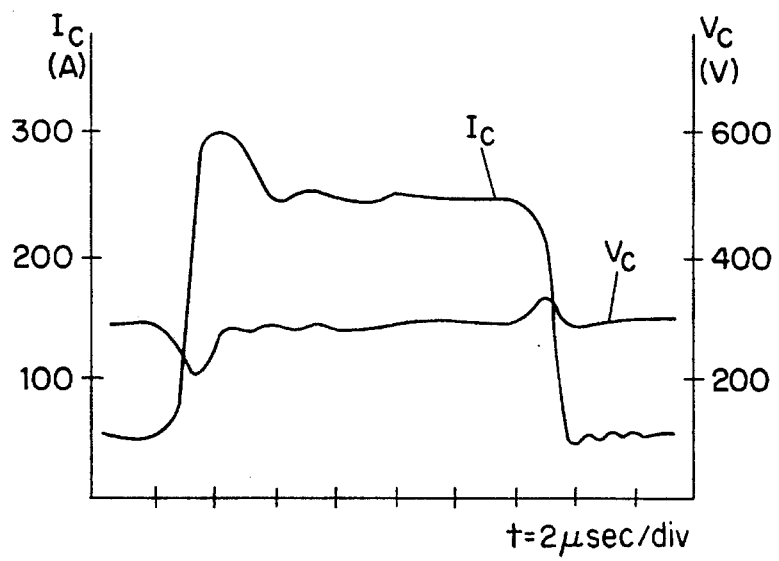
FIG. 7 is a graph showing a main current and a voltage $V_D$ across the main element 1 while the protective circuit of FIG. 6 limits an overcurrent.
Figure 8:
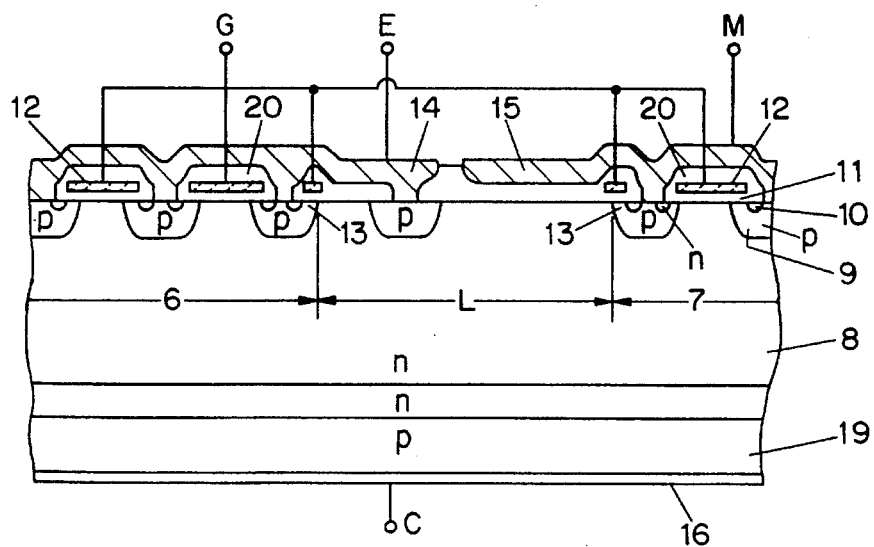
FIG. 8 is a sectional view showing a part of a typical IGBT device.
Figure 9A:
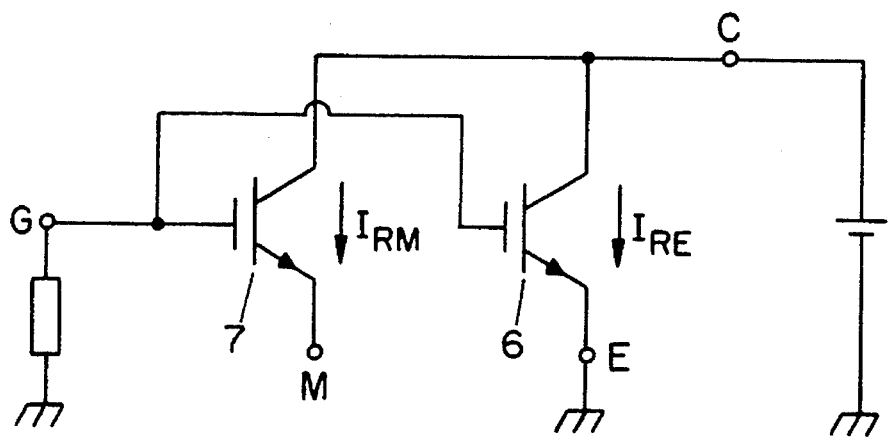
FIG. 9(*a*) is a circuit diagram showing an equivalent circuit of the IGBT having a sensing cell, with the source electrode terminal open.
Figure 9B:
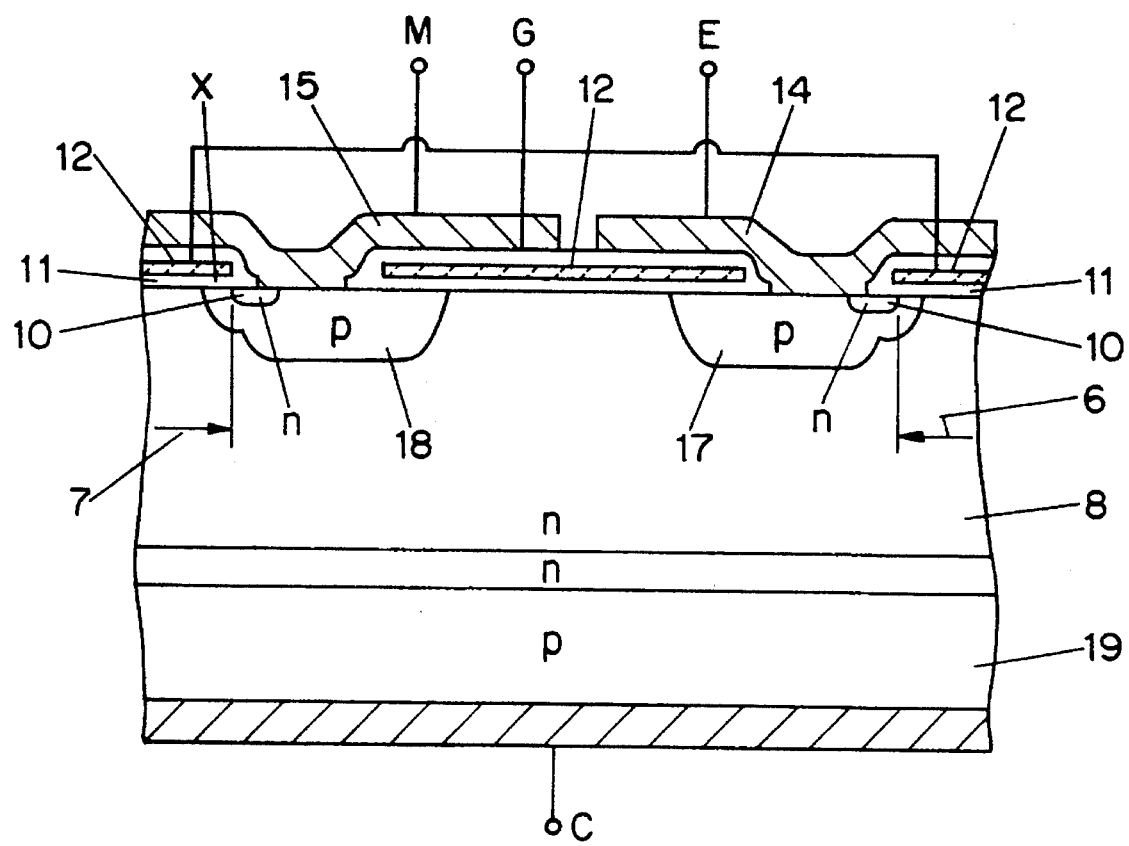
Figure 10:
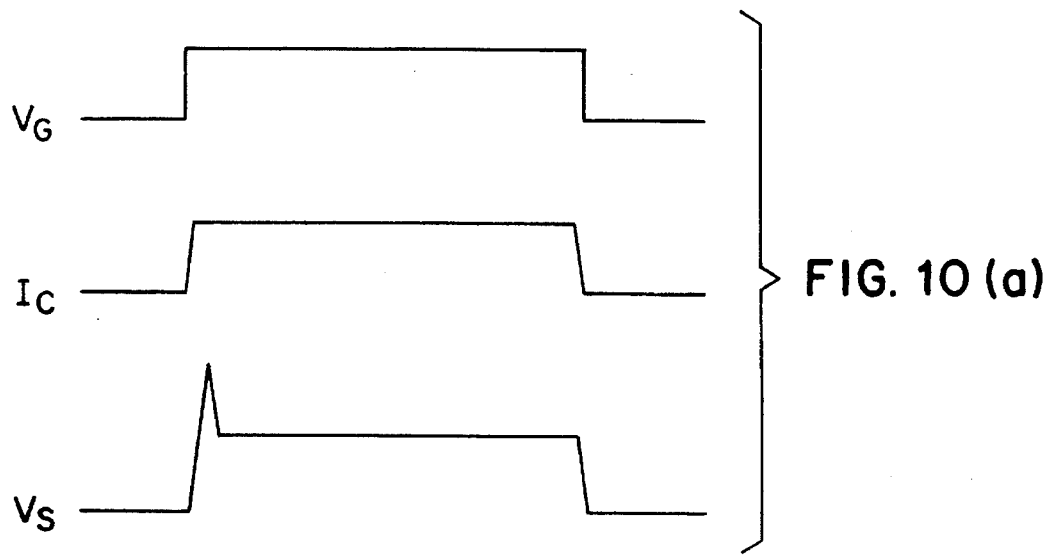
FIG. 10 (*a*) is a graph illustrating the spike noise in the detected voltage $V_S$.
Figure 10:
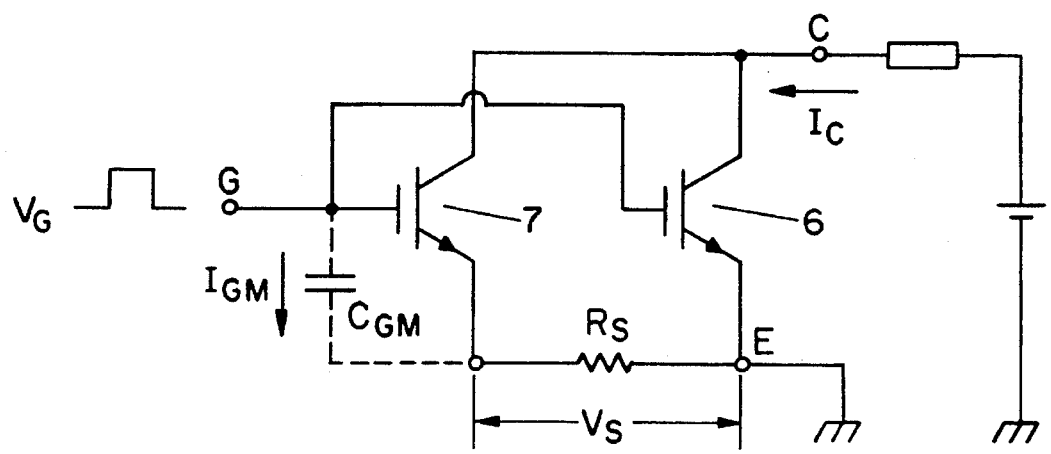

In the spacing region between sensing cell portion 7 and the main cell portion 6, the gate electrode 12 is not formed under the extension of the emitter electrode 15, as shown in FIG. 5(b). This narrows the overlapping area of the electrodes 12 and 15 as much as possible. Since the sensing cell portion 7 is formed with an island shape so as to be surrounded by the wells for capturing the minority carriers, the gate electrode should be connected to the sensing cell portion 7. Accordingly, the gate electrode 12 is extended, as shown In FIG. 5(c), over the spacing region while the extension of the emitter electrode 15 of the sensing cell portion 7 is shortened in the B—B' section so as to narrow the overlapping area of the electrodes 12 and 15. Thus, the capacitance $C_{GM}$ between the gate electrode 12 and the emitter electrode 15 is reduced. In this manner, the spike noise voltage which the displacement current causes across the current detecting resistor at the turn-on of the IGBT is reduced.

While the present invention has been described by way of examples of the IGBT, the invention is similarly applicable to other vertical MOS semiconductor devices, e.g., MOSFETs and MOS control thyristors (MCT).

We claim:

1. A vertical MOS semiconductor device comprising:
   (a) a semiconductor layer of a first conductivity type;
   (b) a main cell portion comprising
      a first base region of a second conductivity type formed selectively at a first surface of the semiconductor layer,
      a first emitter region of the first conductivity type formed selectively in the surface of the first base region,
      a gate electrode fixed via a gate oxide film to a portion of the first base region extending between the semiconductor layer and the first emitter region, and
      an emitter electrode connected to the surfaces of the first base region and the first emitter region;
   (c) a sensing cell portion for detecting a current of the main cell portion comprising
      a second base region of a second conductivity type formed selectively at a second surface of the semiconductor layer,
      a second emitter region of the first conductivity type formed selectively at the surface of the second base region,
      a gate electrode fixed via a gate oxide film to a portion of the second base region extending between the semiconductor layer and the second emitter region, and
      an emitter electrode connected to the second base region and the second emitter region;
   (d) a first well region of the second conductivity type formed between the main and sensing cell portions, the first well region being connected to the emitter electrode of the sensing cell portion; and
   (e) a second well region of the second conductivity type formed between the main and sensing cell portions, the second well region being connected to the emitter electrode of the main cell portion.

2. The vertical MOS semiconductor device as claimed in claim 1, wherein the first well region has an annular shape.

3. The vertical MOS semiconductor device as claimed in claim 1, wherein the second well region has an annular shape.

4. The vertical MOS semiconductor device as claimed in claim 1, wherein insulation withstand voltage between the emitter electrodes of the main and sensing cell portions is lower than withstand voltage of the gate insulating film.

5. The vertical MOS semiconductor device as claimed in claim 1, wherein the first and second wells are spaced by a distance in a range from 5 to 20 μm.

6. A vertical MOS semiconductor device comprising:
   (a) a semiconductor layer of a first conductivity type;
   (b) a main cell portion comprising
      a first base region of a second conductivity type formed selectively at a first surface of the semiconductor layer,
      a first emitter region of the first conductivity type formed selectively in the surface of the first base region,
      a gate electrode fixed via a gate oxide film to a portion of the first base region extending between the semiconductor layer and the first emitter region, and
      an emitter electrode connected to the surfaces of the first base region and the first emitter region;
   (c) a sensing cell portion for detecting a current of the main cell portion comprising
      a second base region of a second conductivity type formed selectively at a second surface of the semiconductor layer,
      a second emitter region of the first conductivity type formed selectively at the surface of the second base regions,
      a gate electrode fixed via a gate oxide film to a portion of the second base region extending between the semiconductor layer and the second emitter region, and
      an emitter electrode connected to the second base region and the second emitter region;
   (d) a first well region formed between the main and sensing cell portions, the first well region being connected to the emitter electrode of the sensing cell portion; and
   (e) a second well region formed between the main and sensing cell portions, the second well region being connected to the emitter electrode of the main cell portion;
   wherein an overlap between the gate electrode and the emitter electrode of the sensing cell portion is minimized.

7. The vertical MOS semiconductor device as claimed in claim 6, wherein the gate electrode of the sensing cell is configured and disposed for minimization of the overlap with the emitter electrode.

8. The vertical MOS semiconductor device as claimed in claim 6, wherein the emitter electrode of the sensing cell is configured and disposed for minimization of the overlap with the gate electrode.

* * * * *

UNITED STATES PATENT AND TRADEMARK OFFICE
CERTIFICATE OF CORRECTION

PATENT NO.   : 5,559,355
DATED        : September 24, 1996
INVENTOR(S)  : Yamazaki et al.

It is certified that error appears in the above-indentified patent and that said Letters Patent is hereby corrected as shown below:

Column 3, line 36, "capacitance" should read --capacitance $C_{GM}$--;

Column 8, line 30, "regions" should read --region--.

Signed and Sealed this

Fifteenth Day of April, 1997

BRUCE LEHMAN

Attest:

Attesting Officer       Commissioner of Patents and Trademarks